(12) United States Patent
Man et al.

(10) Patent No.: US 9,260,782 B2
(45) Date of Patent: Feb. 16, 2016

(54) SAMPLE PREPARATION METHOD

(71) Applicant: HITACHI HIGH-TECH SCIENCE CORPORATION, Tokyo (JP)

(72) Inventors: Xin Man, Tokyo (JP); Ikuko Nakatani, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 254 days.

(21) Appl. No.: 13/842,184

(22) Filed: Mar. 15, 2013

(65) Prior Publication Data

US 2013/0251914 A1 Sep. 26, 2013

(30) Foreign Application Priority Data

Mar. 22, 2012 (JP) ................................ 2012-066006

(51) Int. Cl.
*B05D 3/00* (2006.01)
*C08J 7/18* (2006.01)
*C23C 16/48* (2006.01)
*C23C 16/04* (2006.01)
*H01J 37/305* (2006.01)

(52) U.S. Cl.
CPC ............. *C23C 16/486* (2013.01); *C23C 16/047* (2013.01); *H01J 37/3056* (2013.01); *H01J 2237/31745* (2013.01)

(58) Field of Classification Search
CPC ... H01J 37/28; H01J 37/3005; H01J 37/3006; H01J 37/3076; H01J 37/3178; G01N 1/286; G01N 2001/2886
USPC .......................................... 427/586, 164, 161
See application file for complete search history.

(56) References Cited

U.S. PATENT DOCUMENTS

| | | | |
|---|---|---|---|
| 6,527,967 B1 * | 3/2003 | Suzuki | 216/62 |
| 8,859,963 B2 * | 10/2014 | Moriarty et al. | 250/307 |
| 2005/0082478 A1 | 4/2005 | Tanaka et al. | 250/311 |
| 2007/0158566 A1 | 7/2007 | Ikeda | 250/311 |
| 2010/0276607 A1 | 11/2010 | Wanzenboeck et al. | 250/440.11 |
| 2011/0226948 A1 * | 9/2011 | Tanaka et al. | 250/307 |

FOREIGN PATENT DOCUMENTS

| | | |
|---|---|---|
| JP | 58104180 | 6/1983 |
| JP | 11101724 | 4/1999 |
| JP | 2009198412 | 9/2000 |
| JP | 2005077244 | 3/2005 |
| JP | 2006071339 | 3/2006 |
| JP | 2007155524 | 6/2007 |

OTHER PUBLICATIONS

Notification of Reasons for Refusal mailed Dec. 1, 2015 issued in Japanese Patent Application No. 2012-066006.

* cited by examiner

*Primary Examiner* — Michael Wieczorek
(74) *Attorney, Agent, or Firm* — Adams & Wilks

(57) ABSTRACT

A sample preparation method includes processing a sample by an ion beam to form a thin film portion having a thickness that allows an electron beam to transmit therethrough; supplying deposition gas to the thin film portion; and irradiating the thin film portion with an electron beam to simultaneously form a deposition film on a front surface of the thin film portion and a deposition film on a rear surface of the thin film portion opposed to the front surface. The electron beam transmits through the thin film portion, generating secondary electrons from both the front and rear surfaces that decompose the deposition gas to form the deposition films.

13 Claims, 6 Drawing Sheets

SAMPLE PREPARATION METHOD

This application claims priority from Japanese Patent Application No. 2012-066006 filed on Mar. 22, 2012, the entire subject-matter of which is incorporated herein by reference.

BACKGROUND OF THE INVENTION

1. Field of the Invention

The present invention relates to a sample preparation method for forming a deposition film on a sample by irradiation of a charged particle beam.

2. Description of the Related Art

Transmission electron microscope (TEM) observation is conventionally known as a method of observing a micro region in a sample for analysis of defects in a semiconductor device or other purposes. In TEM observation, as sample preparation for acquiring a transmission electron image, it is necessary to prepare a TEM sample having a thin film portion in part, which has such a thickness that allows an electron beam to transmit therethrough.

In recent years, as a method of preparing a TEM sample, a TEM sample preparation method using a focused ion beam has been used. In this method, a peripheral portion of a sample is subjected to etching processing such that a portion including a desired observation region inside the sample may be left. Then, the remaining portion is subjected to etching processing until the remaining portion has such a thickness that allows an electron beam to transmit therethrough, to thereby form a thin film portion. In this manner, a TEM sample can be prepared with pinpoint accuracy with regard to the portion including the desired observation region.

However, there has been a problem in that, in preparing the TEM sample, if the thickness of the thin film portion becomes smaller, the thin film portion is curved due to internal stress. As a method for solving the problem, there is disclosed a method of preventing the curvature by forming a reinforcement layer made of a deposition film on the thin film portion (see JP-A-2009-198412).

According to this method, however, in the case of forming a thin film portion having an extremely small thickness, the thin film portion may be curved by a tension of the deposition film.

SUMMARY OF THE INVENTION

Illustrative aspects of the present invention provide a sample preparation method for forming deposition films on both an observation surface of a thin film portion and a surface opposite thereto, which is thus capable of preparing a sample while reducing curvature even when the thin film portion has an extremely small thickness.

According to one illustrative aspect of the present invention, there is provided a sample preparation method, including: processing a sample piece by an ion beam, thereby forming a thin film portion having such a thickness that allows an electron beam to transmit therethrough; supplying deposition gas to the thin film portion; and irradiating the thin film portion with the electron beam, thereby forming a first deposition film on a first surface of the thin film portion on an incident side of the electron beam and a second deposition film on a second surface of the thin film portion which is opposite to the first surface.

With this configuration, the deposition films can be formed on the first surface and the second surface by the same electron beam, and hence a tension is applied to the thin film portion from both the surfaces. Thus, the thin film portion is prevented from being curved.

According to the sample preparation method of the present invention, the deposition films can be formed on both surfaces of the thin film portion, and hence a sample can be prepared without curving the thin film portion.

DETAILED DESCRIPTION

A sample preparation method according to an embodiment of the present invention will be described below.

Figure 1:
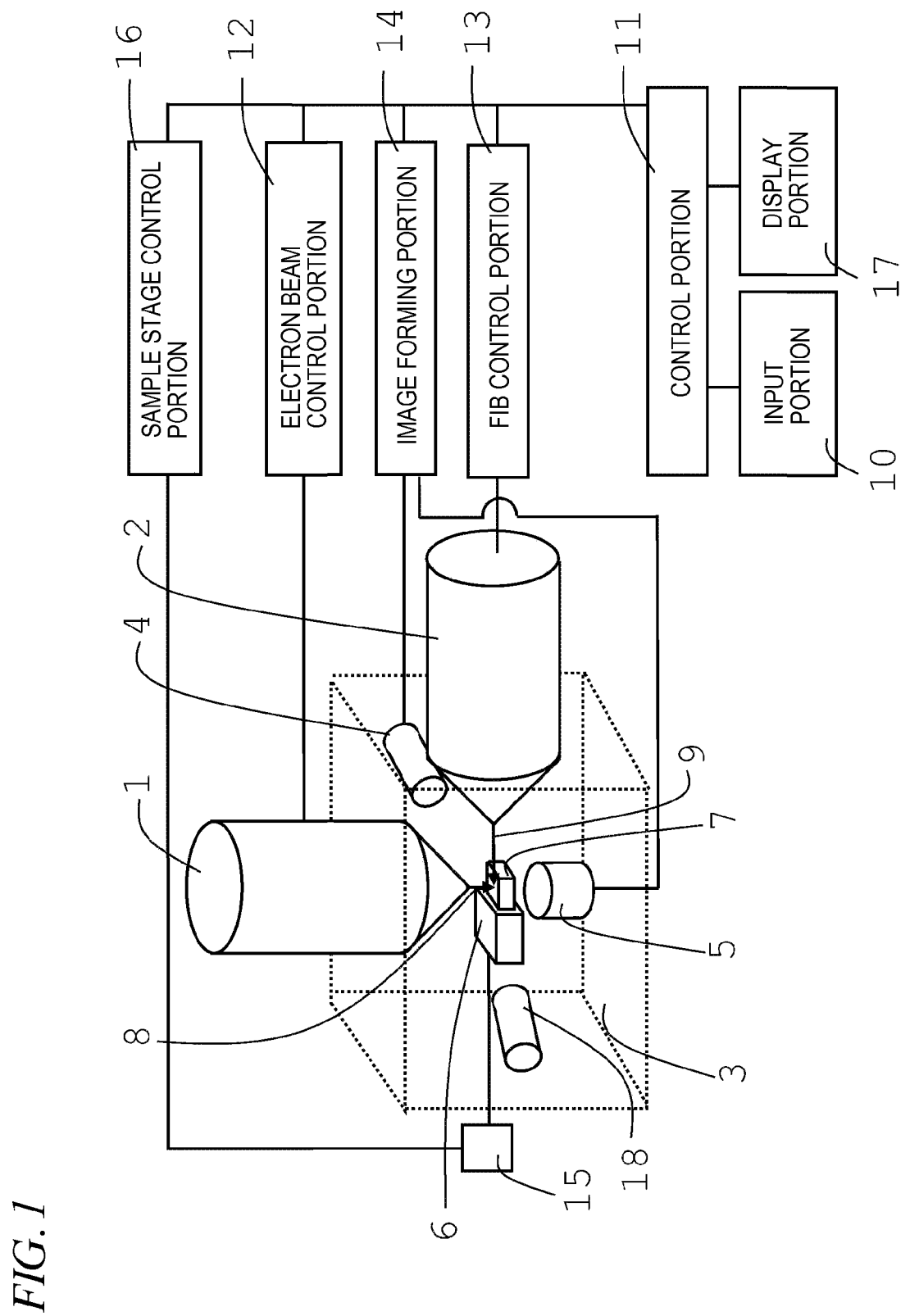
FIG. 1 is a configuration diagram of a charged particle beam apparatus according to an embodiment of the present invention.

First, a charged particle beam apparatus for performing the sample preparation method will be described. As illustrated in FIG. 1, the charged particle beam apparatus includes an EB column 1, a FIB column 2, and a sample chamber 3. The EB column 1 and the FIB column 2 irradiate a sample 7 accommodated in the sample chamber 3 with an electron beam 8 and an ion beam 9, respectively. The EB column 1 and the FIB column 2 are arranged such that the irradiation axes thereof may be orthogonal to each other on the sample 7.

The charged particle beam apparatus further includes a secondary electron detector 4 and a transmission electron detector 5 as charged particle detectors. The secondary electron detector 4 is capable of detecting secondary electrons generated from the sample 7 by irradiation of the electron beam 8 or the ion beam 9. The transmission electron detector 5 is provided at a position facing the EB column 1. The transmission electron detector 5 is capable of detecting transmitted electrons that have transmitted through the sample 7 and the electron beam 8 that has not entered the sample 7 as a result of the irradiation of the electron beam 8 to the sample 7.

The charged particle beam apparatus further includes a sample stage 6 for holding the sample 7. The sample stage 6 is driven by a sample stage drive portion 15, and the movement of the sample stage 6 is controlled by a sample stage control portion 16. The sample stage drive portion 15 moves the sample stage 6 in three axis directions of the X, Y, and Z directions. Further, the sample stage drive portion 15 tilts the sample stage 6.

The charged particle beam apparatus further includes an EB control portion 12, a FIB control portion 13, an image forming portion 14, and a display portion 17. The EB control portion 12 transmits an irradiation signal to the EB column 1 to control the EB column 1 to radiate the electron beam 8. The FIB control portion 13 transmits an irradiation signal to the FIB column 2 to control the FIB column 2 to radiate the ion beam 9.

The image forming portion 14 forms a transmission electron image based on a signal for scanning the electron beam 8 sent from the EB control portion 12 and a signal of the transmission electrons detected by the transmission electron detector 5. The display portion 17 is capable of displaying the transmission electron image. The image forming portion 14 forms data of a SEM image based on the signal for scanning the electron beam 8 sent from the EB control portion 12 and a signal of the secondary electrons detected by the secondary electron detector 4. The display portion 17 is capable of displaying the SEM image. Further, the image forming portion 14 forms data of a SIM image based on a signal for scanning the ion beam 9 sent from the FIB control portion 13 and a signal of the secondary electrons detected by the secondary electron detector 4. The display portion 17 is capable of displaying the SIM image.

The charged particle beam apparatus further includes an input portion 10 and a control portion 11. An operator inputs conditions on the apparatus control to the input portion 10. The input portion 10 transmits the input information to the control portion 11. The control portion 11 transmits a control signal to the EB control portion 12, the FIB control portion 13, the image forming portion 14, the sample stage control portion 16, or the display portion 17, to thereby control the operation of the charged particle beam apparatus.

The charged particle beam apparatus further includes a gas gun 18 for supplying deposition gas to the sample 7. The gas gun 18 sprays the sample 7 with raw material gas. The sample 7 is disposed perpendicularly to the EB column 1, and hence the gas gun 18 can spray a surface of the sample on the EB column 1 side and a surface thereof on the opposite side with the raw material gas uniformly. The sample 7 sprayed with the raw material gas is irradiated with the electron beam 8 or the ion beam 9, to thereby form a deposition film in the irradiated region. As the raw material gas, carbon-based gas whose main component is carbon, such as naphthalene and phenanthrene, or organic compound gas containing platinum or tungsten is used.

Figure 2A:
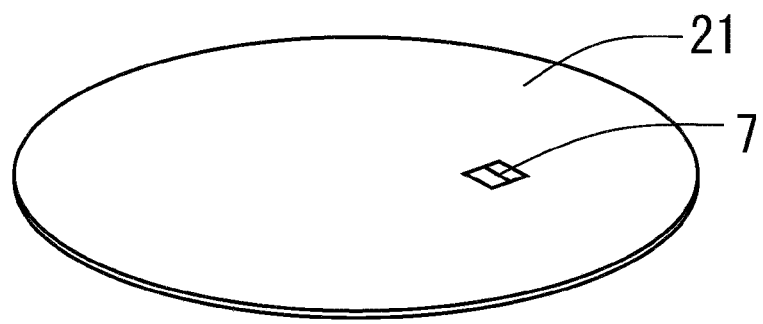
FIGS. 2A and 2B are explanatory diagrams of a sample preparation method according to the embodiment of the present invention.
Figure 2B:
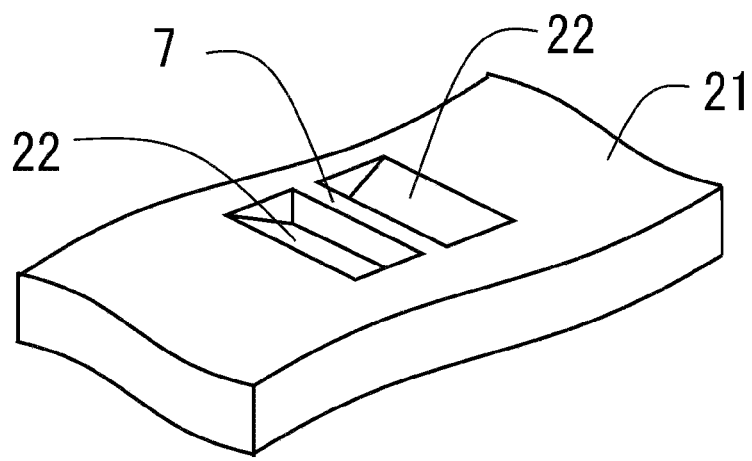

Next, the sample preparation method in this embodiment will be described. In the sample preparation method, as illustrated in FIG. 2A, a wafer 21 is partially processed by the ion beam 9, to thereby prepare the sample 7. FIG. 2B is an enlarged diagram of the sample 7 and its vicinity. The wafer 21 is irradiated with the ion beam 9 to form a processing groove 22 such that the sample 7 may be left. Then, the sample 7 is separated from the wafer 21 and is fixed to the sample stage 6.

Figure 3A:
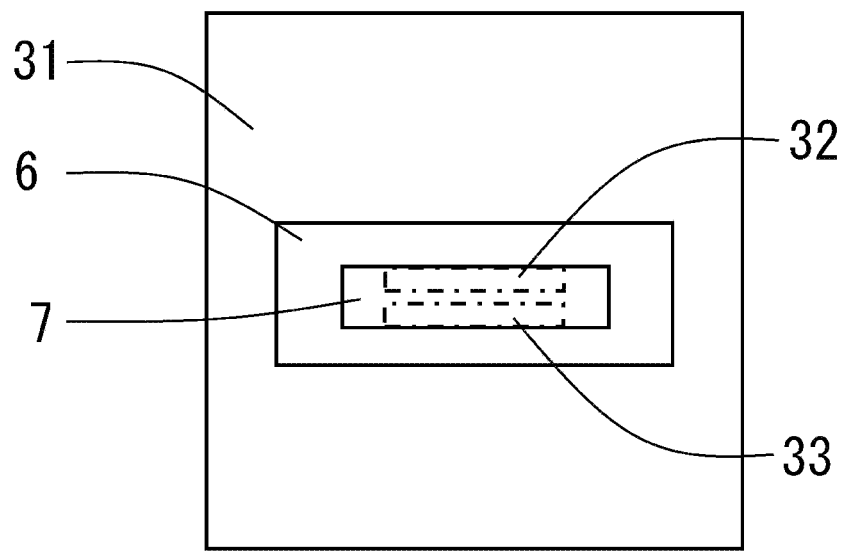
FIGS. 3A and 3B are further explanatory diagrams of the sample preparation method according to the embodiment of the present invention.

Next, the sample 7 is subjected to processing for forming a thin film portion thereon. FIG. 3A is a SIM image 31 acquired by scanning and irradiating the sample 7 with the ion beam 9 from the FIB column 2. In the SIM image 31, irradiation regions 32 and 33 of the ion beam 9 for forming the thin film portion by the ion beam 9 are set. The irradiation regions 32 and 33 are set such that the thin film portion may have a thickness that allows the electron beam 8 to transmit therethrough.

Figure 3B:
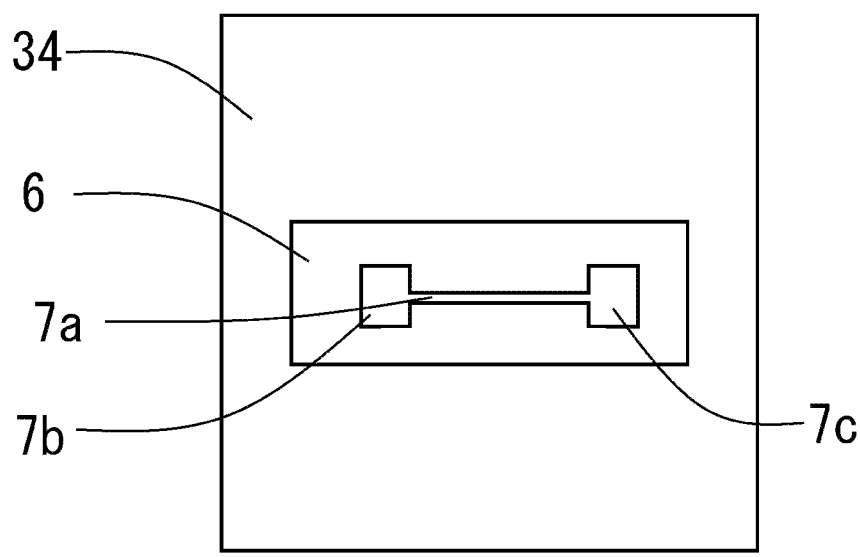

Next, the irradiation regions 32 and 33 are irradiated with the ion beam 9 to subject the sample 7 to etching processing. Then, as illustrated in FIG. 3B, a thin film portion 7a is formed. In other words, the sample 7 is formed of support portions 7b and 7c having a large thickness and the thin film portion 7a having a small thickness.

Next, a deposition film for preventing curvature of the thin film portion 7a is formed.

Figure 4A:
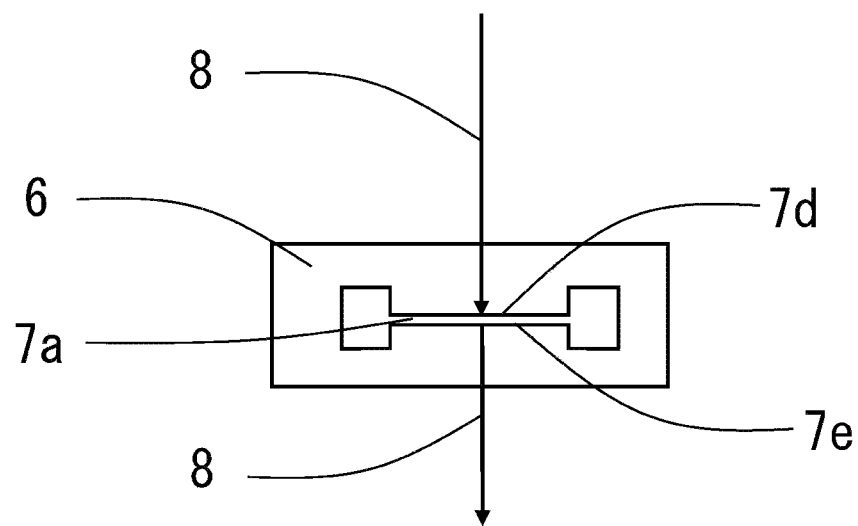
FIGS. 4A and 4B are still further explanatory diagrams of the sample preparation method according to the embodiment of the present invention.

First, the principle of forming the deposition film will be described with reference to FIGS. 4A and 4B. As illustrated in FIG. 4A, when the electron beam 8 is radiated toward the thin film portion 7a, secondary electrons are generated from a front surface 7d of the thin film portion 7a on the electron beam (EB) column 1 side. The electron beam 8 transmits through the thin film portion 7a, and hence secondary electrons are generated also from a rear surface 7e on the opposite side of the front surface 7d. In other words, secondary electrons are generated from both surfaces of the thin film portion 7a at the positions irradiated with the electron beam 8. The secondary electrons are used to form deposition films on both surfaces of the thin film portion 7a at the same time. In other words, the front surface 7d and the rear surface 7e of the thin film portion 7a are sprayed with deposition gas uniformly, and the front surface 7d is irradiated with the electron beam 8, with the result that secondary electrons are generated from both surfaces of the thin film portion 7a at the irradiated positions to decompose the deposition gas. In this manner, a decomposed component is deposited on the thin film portion 7a.

Figure 4B:
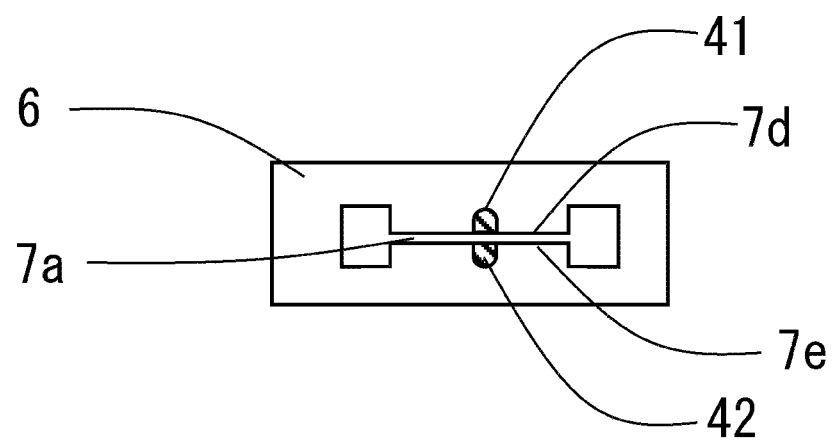

As a result of spraying the thin film portion 7a with the deposition gas and irradiating the thin film portion 7a with the electron beam 8 as illustrated in FIG. 4A, a deposited material 41 and a deposited material 42 are formed on the front surface 7d and the rear surface 7e, respectively, as illustrated in FIG. 4B. The deposited materials can be formed on both surfaces at the positions irradiated with the electron beam 8. Therefore, by scanning and irradiation of the electron beam 8, the deposition film made of the deposited material is formed.

Figure 5A:
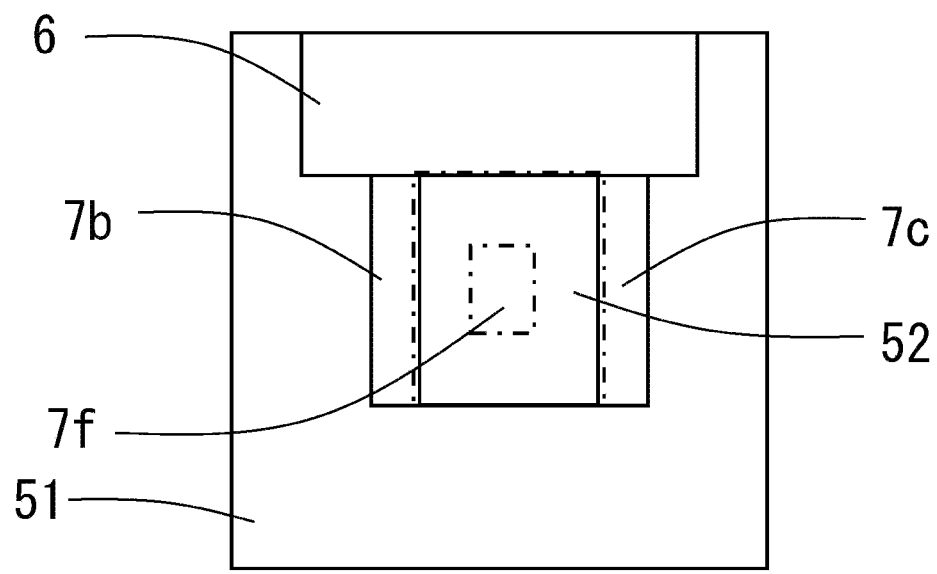
FIGS. 5A and 5B are still further explanatory diagrams of the sample preparation method according to the embodiment of the present invention.

Description is given of the formation of a deposition film. FIG. 5A is a SEM image 51 of the sample 7 acquired by scanning and irradiation of the electron beam 8 from the EB column 1. The SEM image 51 is a SEM image observed from the front surface 7d side of the thin film portion 7a. In the SEM image 51, an irradiation region 52 of the electron beam 8 for forming a deposition film is set. The irradiation region 52 is set as an entire surface excluding an observation region 7f of the front surface 7d of the thin film portion 7a. This is because the thin film portion 7a has a small thickness and hence, if the deposition film is formed locally, a tension is generated locally to curve the thin film portion 7a.

Figure 5B:
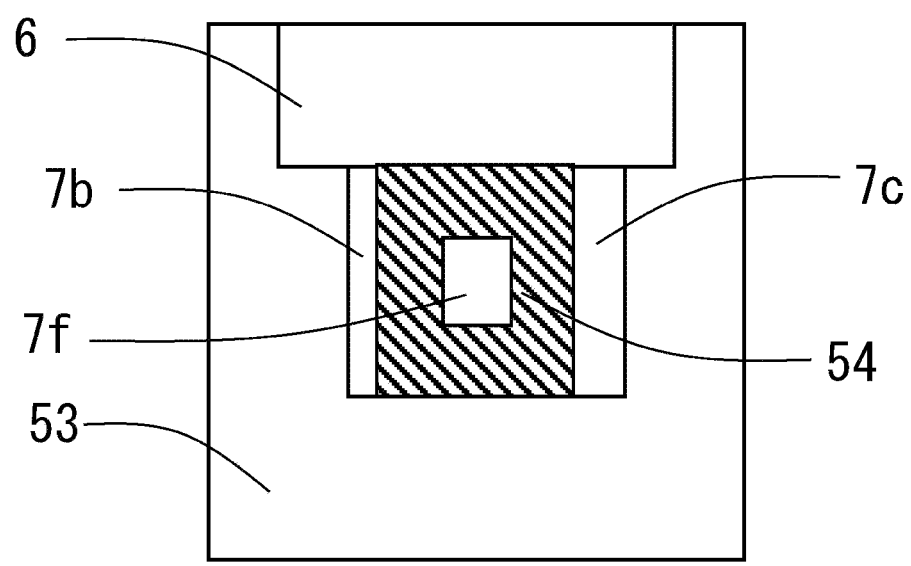

Next, the irradiation region 52 is scanned and irradiated with the electron beam 8 while the thin film portion 7a is sprayed with the deposition gas. In order to form a deposition film having a uniform thickness, it is preferred to irradiate the irradiation region 52 with the electron beam 8 in a direction perpendicular to the front surface 7d. In this manner, as illustrated in FIG. 5B, a deposition film 54 that covers the front surface 7d of the thin film portion 7a can be formed. As described above, a deposition film is also formed on the rear surface 7e of the thin film portion 7a at the same time.

According to this method, films are formed by depositing deposited materials on the front surface 7d and the rear surface 7e of the thin film portion 7a at the same time at the opposed positions across the thin film portion 7a. Thus, a deposition film can be formed without applying a tension locally to the thin film portion 7a having a small thickness.

In the formation of the deposition film by the above-mentioned method, when the thickness of the deposition film becomes larger, the amount of the electron beam that transmits through the deposition film and the thin film portion 7a is reduced. In this case, the growth rate of the deposition film may differ between the front surface 7d side and the rear surface 7e side. To deal with this problem, the growth rate of the deposition film on the front surface 7d side and the rear surface 7e side is adjusted by etching processing using the ion beam 9.

Figure 6A:
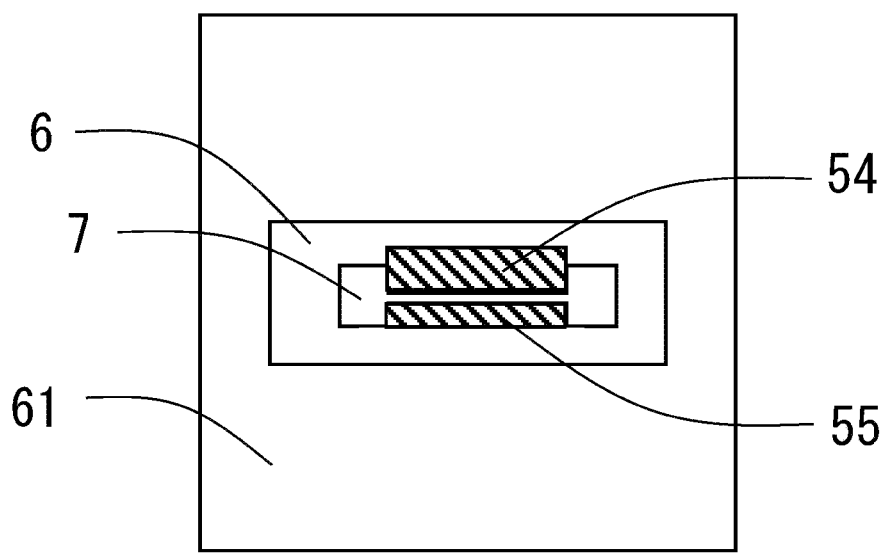
FIGS. 6A and 6B are still further explanatory diagrams of the sample preparation method according to the embodiment of the present invention.
Figure 6B:
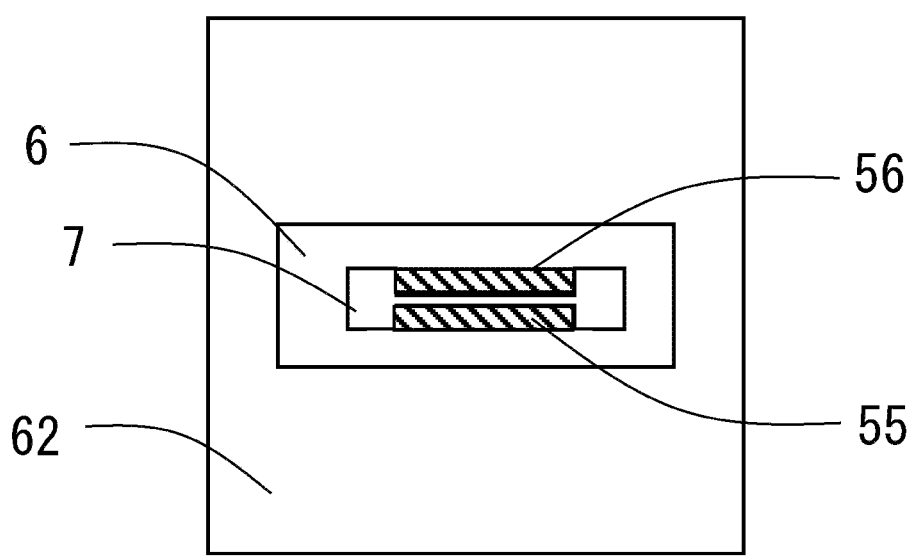

FIG. 6A is a SIM image 61 acquired by scanning and irradiating the sample 7 with the ion beam 9 from the FIB column 2 after the formation of the deposition film. The thickness of the deposition film 54 formed on the front surface 7d of the thin film portion 7a is larger than the thickness of a deposition film 55 formed on the rear surface 7e. Then, the deposition film 54 is irradiated with the ion beam 9 to perform etching processing such that the thickness of the deposition film 54 may become equal to the thickness of the deposition film 55. In this manner, as illustrated in a SIM image 62 of FIG. 6B, the deposition film 56 having the same thickness as the thickness of the deposition film 55 can be formed. Further, an additional deposition film can be formed until the required thickness is reached.

In this case, the etching processing by the ion beam 9 is performed so as to reduce the thickness of the deposition film 54, and hence it is preferred to irradiate the deposition film 54 with the ion beam 9 from a thickness direction or a direction perpendicular to the thickness direction. This is because the thickness of the deposition film 54 can be reduced uniformly. In the apparatus in which the EB column 1 and the FIB column 2 are arranged such that the irradiation axes thereof are orthogonal to each other on the sample 7, the deposition film 54 can be irradiated with the ion beam 9 from the direction perpendicular to the thickness direction thereof without the need to tilt the sample stage 6 to change the angle of the sample 7. Thus, the deposition film 56 having a uniform thickness can be formed efficiently.

The above description is the processing method using the apparatus in which the electron beam 8 and the ion beam 9 are orthogonal to each other. Alternatively, however, even when the electron beam 8 and the ion beam 9 are not orthogonal to each other, a sample can be prepared in a manner that the sample stage 6 is tilted to change the angle of the sample 7 in the deposition step and the etching processing step.

What is claimed is:

1. A sample preparation method, comprising:
processing a sample piece by an ion beam to form a thin film portion having a thickness that allows an electron beam to transmit therethrough;
supplying deposition gas to the thin film portion; and
irradiating the thin film portion with an electron beam to simultaneously form a first deposition film on a first surface of the thin film portion which is an incident side of the electron beam and a second deposition film on a second surface of the thin film portion through which the electron beam has transmitted the thin film portion.

2. The sample preparation method according to claim 1, further comprising: subjecting the first deposition film to etching processing by the ion beam, thereby reducing a thickness of the first deposition film.

3. The sample preparation method according to claim 2, wherein the reducing a thickness of the first deposition film comprises subjecting the first deposition film to the etching processing by the ion beam such that the thickness of the first deposition film becomes equal to a thickness of the second deposition film.

4. The sample preparation method according to claim 3, wherein the thin film portion is irradiated with the ion beam from a direction perpendicular to an irradiation direction of the electron beam.

5. The sample preparation method according to claim 2, wherein the thin film portion is irradiated with the ion beam from a direction perpendicular to an irradiation direction of the electron beam.

6. The sample preparation method according to claim 1, wherein the supplying deposition gas to the thin film portion comprises supplying the deposition gas to both of the front surface and the rear surface of the thin film portion.

7. The sample preparation method according to claim 1, wherein the irradiating the thin film portion with the electron beam comprises irradiating a substantially entire surface excluding an observation region of the first surface.

8. A sample preparation method, comprising:
processing a sample by an ion beam to form a thin film portion having opposed surfaces and a thickness that allows an electron beam to transmit therethrough;
spraying, at the same time, the opposed surfaces of the thin film portion with a deposition gas; and
simultaneously forming a deposition film on each of the opposed surfaces by irradiating the thin film portion with an electron beam that transmits through the thin film portion and generates secondary electrons from both opposed surfaces that decompose the sprayed deposition gas to form the deposition films.

9. The sample preparation method according to claim 8; further comprising using the ion beam to etch the deposition film formed on one of the opposed surfaces to reduce the thickness thereof.

10. The sample preparation method according to claim 9; wherein the etching of the deposition film formed on one of the opposed surfaces is carried out until the thickness thereof is equal to the thickness of the deposition film formed on the other of the opposed surfaces.

11. The sample preparation method according to claim 10, wherein the thin film portion is irradiated with the ion beam from a direction perpendicular to an irradiation direction of the electron beam.

12. The sample preparation method according to claim 8, wherein the thin film portion is irradiated with the ion beam from a direction perpendicular to an irradiation direction of the electron beam.

13. The sample preparation method according to claim 8, wherein the electron beam is irradiated in a direction substantially perpendicular to the thin film portion.

* * * * *